(12) United States Patent
Tanaka et al.

(10) Patent No.: US 7,755,454 B2
(45) Date of Patent: Jul. 13, 2010

(54) MICRO-ELECTROMECHANICAL DEVICE

(75) Inventors: Masahiro Tanaka, Kanagawa (JP); Takashi Kinoshita, Kanagawa (JP); Keitaro Yamashita, Kanagawa (JP)

(73) Assignee: Sony Corporation, Tokyo (JP)

( * ) Notice: Subject to any disclaimer, the term of this patent is extended or adjusted under 35 U.S.C. 154(b) by 91 days.

(21) Appl. No.: 12/095,089

(22) PCT Filed: Nov. 8, 2006

(86) PCT No.: PCT/JP2006/322274
§ 371 (c)(1),
(2), (4) Date: May 27, 2008

(87) PCT Pub. No.: WO2007/060838
PCT Pub. Date: May 31, 2007

(65) Prior Publication Data
US 2009/0039979 A1   Feb. 12, 2009

(30) Foreign Application Priority Data
Nov. 28, 2005  (JP) .............................. 2005-342518

(51) Int. Cl.
*H03H 9/00* (2006.01)
*H03H 9/70* (2006.01)
(52) U.S. Cl. ...................... 333/186; 333/197
(58) Field of Classification Search .............. 333/186, 333/197, 198; 310/330
See application file for complete search history.

(56) References Cited
U.S. PATENT DOCUMENTS
5,839,062 A   11/1998   Nguyen et al.
6,424,074 B2 *  7/2002   Nguyen ....................... 310/309
6,489,864 B2 * 12/2002   Frey et al. .................... 333/197

FOREIGN PATENT DOCUMENTS

| JP | 2003-532323 | 10/2003 |
|----|-------------|---------|
| JP | 2005-005847 | 1/2005 |
| JP | 2005-142852 | 6/2005 |
| JP | 2005-244406 | 9/2005 |
| JP | 2005-318217 | 11/2005 |
| JP | 2005318217  | 11/2005 |

OTHER PUBLICATIONS

C. T-Nguyen; Micromechanical components for miniaturized low-power communications, proceedings; 1999 IEEE MTT-S International Microwave Symposium RF MEMS Workshop.

A.C. Wong et al.; Microwav mixier and filters; Technical Digest IEEE-IEDM; 1998; pp. 471-478.

(Continued)

*Primary Examiner*—Dean O Takaoka
(74) *Attorney, Agent, or Firm*—Sonnenschein Nath & Rosenthal LLP

(57) ABSTRACT

Provided is a micro-electromechanical device capable of processing an electric signal in the high frequency region by a simple device structure. The micro-electromechanical device is formed, including an oscillator element having a plurality of electrodes disposed on a substrate and a beam facing the electrodes to oscillate by electrostatic drive. An input/output of a high frequency signal is applied to one of the combinations of the electrodes and the beam.

20 Claims, 13 Drawing Sheets

OTHER PUBLICATIONS

Fang Chen et al.; CMOS-MEMS Resonat RF Mixed Filters; IEEE 2005; pp. 24-27.
International Search Report dated Nov. 28, 2005.
European Search Report corresponding to European Serial No. 06823178 dated Sep. 9, 2009.
Chen, F.; CMOS-MEMS Resonat RF Mixed Filters, IEEE 2005, pp. 24-27.
Nguyen, E. T. et al.; Micromechanical Mixer-Filters ("Mixers"); Journal of Microelectromechanical Systems, IEEE Service Center, vol. 13, No. 1; Feb. 1, 2004; pp. 100-112.

* cited by examiner $f(IF) = f(RF) - f(LO)$

MICRO-ELECTROMECHANICAL DEVICE

TECHNICAL FIELD

The invention generally relates to micro-electromechanical devices including micro-electromechanical elements of electrostatic drive type (so-called oscillator elements). More particularly, the invention relates to a micro-electromechanical device capable of processing analogue electric signals, particularly electric signals in high frequency (RF) region, and performing frequency conversion and filtering of the signals utilizing resonance phenomena of mechanical oscillators.

BACKGROUND ART

Micro oscillators formed by the micro-machine (MEMS: micro-electromechanical systems) technologies are known as MEMS resonators of the electrostatic drive type, for example. Such MEMS resonators have been proposed by several research institutions including University of Michigan (see Non-Patent Document 1). In addition, several attempts have been proposed by research institutions including also University of Michigan, to adapt MEMS resonators of the electrostatic drive type for the frequency conversion of high frequency signals (see Non-Patent Documents 2 and 3). Since thus proposed frequency conversion element utilizes the longitudinal or transversal primary oscillation mode, and the element has low output and a complicated configuration, the production of the element while maintaining homogeneity as industrial products may be encountered by considerable difficulties.

[Non-Patent Document 1] C. T.-C. Nguyen, "Micromechanical components for miniaturized low-power communications (invited plenary)," Proceedings, 1999, IEEE MTT-S International Microwave Symposium RF MEMS Workshop, Jun. 18, 1999, pp. 48-77.

[Non-Patent Document 2] A.-C. Wong, H. Ding, and C. T.-C. Nguyen, "Microwave mixer+filters," Technical Digest, IEEE-IEDM, 1998, pp. 47-474.

[Non-Patent Document 3] Fang Chen, Jay Brotz, Umut Arslan, Chiung—Cheng Lo, Tamal Mukherjee, and Gary K. Fedder, "CMOS-MEMS Resonant RF mixer—filters," IEEE 2005, pp. 24-27.

DISCLOSURE OF INVENTION

The elements which have been proposed from fundamental research's standpoint such as, for example, those disclosed in the non-patent documents 2, 3, are complicated in shape, and it is difficult to produce the elements having uniform qualities at a low cost using the design as it is. In the case where primary mode oscillators are utilized, for example, although it becomes necessary to include oscillators connected together with an insulating elastic body to prevent through passage of unnecessary signals, resonance frequencies of the oscillators thus formed are required to precisely coincide with each other. Several difficulties are foreseen in producing such elements in large quantities while retaining homogeneous performance, and there is a possibility of causing a substantial increase in production costs. For reasons mentioned above, the configuration method of the element suitable for industrial production is needed.

In addition, the abovementioned elements proposed from fundamental research's standpoint are expected to have low power output, and some measures are required to increase the output by some means or other to alleviate work load of the amplifiers grounded at the preceding and following stages of the elements. This is because, by finding out suitable measures, the reduction in production costs can be expected together with improvements in the performance of application products. Additionally expected is devising the device configuration of a greater compatibility with the circuits to which such elements are suitably applied.

In view of the abovementioned points, this invention is directed to provide a micro-electromechanical device capable of processing an electric signal in the high frequency region by a simple device structure.

The micro-electromechanical device according to the invention is characterized in that the device is formed by including an oscillator element having a plurality of electrodes on a substrate and a beam facing the electrodes to oscillate by electrostatic drive and that an input/output of high frequency signals is applied to one of the combinations of the electrodes and the beam.

With the micro-electromechanical device according to the invention, mixing of two high frequency signals is feasible. Particularly, these two high frequency signals are mixed by the beam, the signals in a desired bandwidth are selected, and a signal having the differential frequency between the two high frequency signals is output, that is, the function of frequency conversion and filtering is obtained.

According to the micro-electromechanical device of the invention, the processing of electric signals in the high frequency region is feasible by a simple device structure. As a result, simplification of circuit configurations can be carried out, and the miniaturization of elements can be achieved. By utilizing the oscillation elements as the micro-electromechanical devices according to the invention, signal mixer-filters having the frequency conversion and filtering capabilities can be formed with miniaturized and simplified oscillation elements.

BEST MODES FOR CARRYING OUT THE INVENTION

Figure 1A:
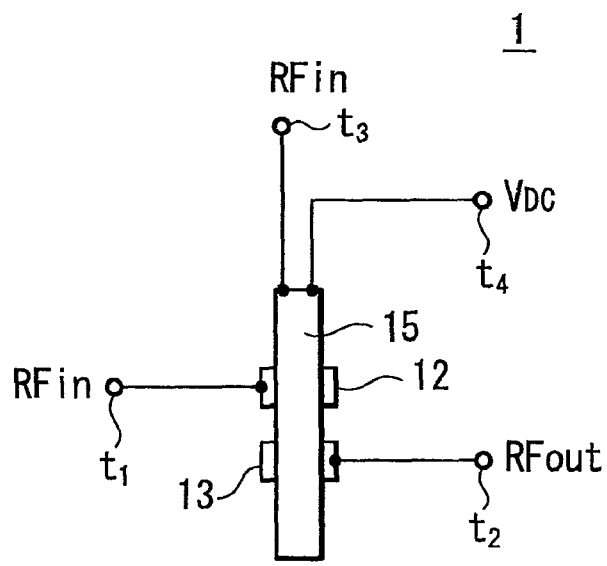
FIGS. 1A, 1B are schematic diagrams illustrating a micro-electromechanical device according to a first embodiment of the invention.

A micro-electromechanical device according to one embodiment of the invention is formed with a micro-mechanical element of the electrostatic drive type, i.e., a micro oscillator element having its plane of oscillation perpendicular to the surface of a substrate. The micro oscillator element is formed, including two or more plural electrodes disposed on the substrate, a cross-beam (so-called beam) facing the electrodes to be capable of oscillating by electrostatic drive, and two signal input terminal ends and one signal output terminal end for use in applying an input/output of a high frequency signal to one of the combinations of the plurality of electrodes and the beam. With the present configuration of the micro oscillator element, mixing of two high frequency signals can be performed.

The micro-electromechanical device according to another embodiment of the invention is configured to include a plurality of the micro oscillator elements, and the elements are connected in parallel with respect to a high frequency signal input into the micro oscillator elements. With the present configuration of the micro-electromechanical device, a signal output can be increased.

The micro-electromechanical device according to still another embodiment of the invention is configured such that resonance frequencies of the plurality of the oscillator elements connected in parallel are distributed throughout a required frequency range. With the present configuration, it becomes feasible, when high frequency signals are subjected to frequency modulation using the required reference signal, the signals included in the signal bandwidth of original high frequency conveyance signals and desired to be taken out can be obtained as output signals without omission.

The micro-electromechanical device according to another embodiment of the invention is configured to include in the oscillator elements, facing the beam, two or more input electrodes for driving the beam. With this configuration, the input impedance of the oscillator elements can be decreased, whereby circuitry matching to the amplifier at the preceding stage can be carried out more easily and the signal output can be increased.

The micro-electromechanical device according to another embodiment of the invention is configured to include in the oscillator elements, facing the beam, two or more output electrodes for deriving an output from the beam. With this configuration, the output impedance of the oscillator elements can be decreased, whereby the circuitry matching to the amplifier at the following stage can be carried out more easily and the signal output can be increased.

The micro-electromechanical device according to another embodiment of the invention is configured such that in the oscillator elements, the portions of the beam, exclusive of the portions either facing the electrodes or serving as the wiring for applying a bias voltage and for transmitting signals, are formed of an insulator. With this construction of the beam, unnecessary noises can be decreased.

The micro-electromechanical device according to another embodiment of the invention is configured to add one or more oscillator elements of the second electrostatic drive type to the output side of the oscillator element. Namely, one or more micro oscillator elements of the electrostatic drive type are added such that an input thereof is connected to the output of another micro oscillator element having three high frequency terminals, whereby these two kinds of micro oscillator elements are included as the components. With this configuration, unnecessary noises can be alleviated.

The micro-electromechanical device according to another embodiment of the invention is configured as a signal mixer-filter. When the device is configured as the mixer-filter, it is feasible to convert the carrier frequency of the high frequency signals into low frequencies and to selectively derive only the signals in necessary bandwidth as well, whereby a substantial simplification of the high frequency circuits can be achieved.

By allowing the signals to transit by means of the capacitor disposed between input/output terminals for alternating-current signals and either the electrode or the beam, the signal mixer-filter becomes capable of electrically isolating the DC bias from signal lines, whereby the mixer-filter element with excellent characteristics can be materialized.

The signal mixer-filter handles balanced input/output signals. To handles the balanced input/output signals, resonators (a group of parallelized oscillator elements) are connected in a lattice-like fashion. By utilizing this filter circuit, its frequency dependence with excellent symmetry of bandwidth transmission characteristics can be achieved.

The micro-electromechanical devices according to the aforementioned embodiments can be adapted to configure the circuit component for selectively deriving desired signals from carrier signals, included in the circuit modules for processing high frequency signals, which are exemplified by semiconductor devices such as SoC (system on chip) device modules, SiP (system in package) device modules, and the like, respectively formed by including micro-electromechanical devices of the electrostatic drive type (so-called oscillator elements). With the present configuration of the micro-electromechanical devices, semiconductor devices of miniature size and power saving while maintaining excellent performance can be offered to customers. As one of the examples of the micro-electromechanical devices, the abovementioned mixer-filter for handling balanced input/output signals can be cited.

Referring now to the drawings, several embodiments of the invention will be detailed. FIGS. 1 through 8 conceptually illustrate micro-electromechanical devices according to the embodiments of the invention. These micro-electromechanical devices of the invention are formed by micro, or nano scale oscillator elements.

Figure 1B:
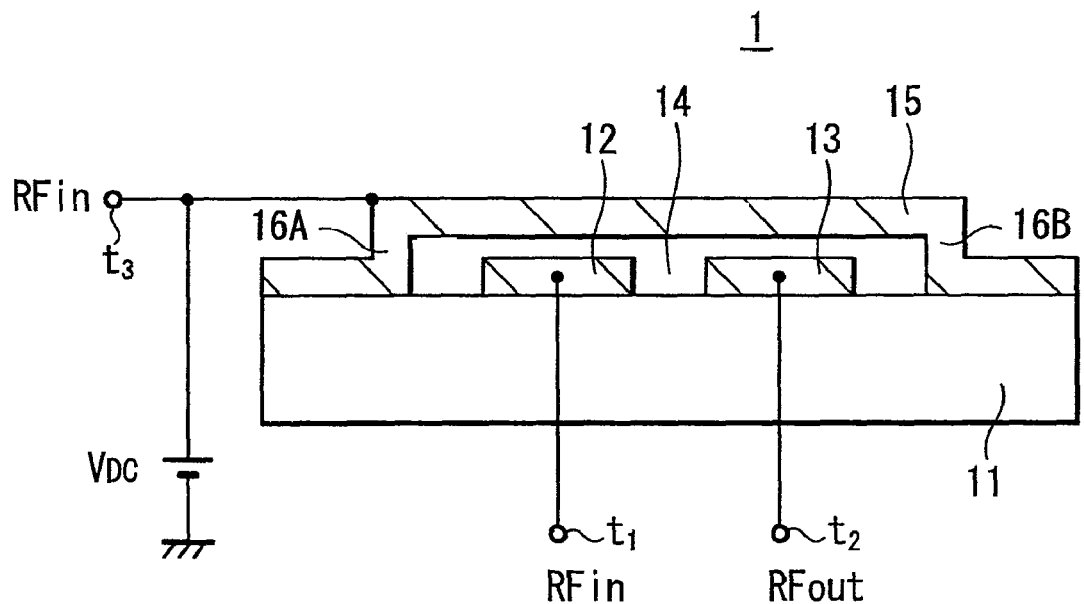

In FIGS. 1A and 1B, a first embodiment according to the invention is shown. A micro-electromechanical device 1 according to the first embodiment is formed with a micro oscillator element including two electrodes 12, 13 disposed on a substrate 11 to be used as lower electrodes, and including an oscillator, i.e., a beam 15, which faces the electrodes 12, 13 across an intervening space 14 and which oscillates by electrostatic drive. The both ends of the beam 15 are each supported onto the substrate 11 by way of supporting portions (or, so-called anchor portions) 16 (16A, 16B). The oscillator element is therefore the one of the secondary oscillation mode.

In addition, according to the first embodiment of the invention, the micro-electromechanical device is configured such that a direct-current bias voltage (hereinafter referred to as DC bias voltage) $V_{DC}$ is applied to the beam 15 through a terminal t4, high frequency signals are each applied to the one of the lower electrodes 12 and the beam 15 different in frequency each other, and a further high frequency signal is output from the other lower electrode 13. Namely, a high frequency signal (RF) used as information is input to either of the lower electrode 12 and beam 15, i.e., to the lower electrode 12 so adapted in the present example through the 1st input terminal t1, and another high frequency signal, a reference frequency signal (L0) in this case, is input to the beam 15 through the 2nd input terminal t3, while an output signal having the differential frequency between the high frequency signal (RF) and the reference frequency signal (L0) is output through the output terminal t2 connected to the electrode 13.

Incidentally, it may be noted in this context that the application of the signals in the following embodiments will be carried out in a manner similar to that mentioned above, in which the high frequency signal as information signal is input to either one of the lower electrodes and the beam, and the reference frequency signal is input to the remainder of the lower electrodes.

As will be described later on, this micro-electromechanical device 1 is capable of selecting a desired bandwidth and carrying out frequency conversion followed by outputting resultant signals, namely, is capable of performing the mixer-filter function including both frequency conversion and filtering.

A substrate 11 is formed including either a substrate of semi-conductive substrate such as silicon substrate, for example, on the surface of which an insulating layer has been formed, or an insulating substrate. In the present example, the substrate 11 is formed by a high-resistive silicon substrate on the surface of which an insulating layer has been formed. Two electrodes 12, 13 as the lower electrodes may be formed, for example, by including any of a polysilicon layer, a layer of metal or other conductive materials, a diffusion layer formed on the semi-conductive substrate, and the like. The polysilicon layer is used for forming the lower electrodes in the present example. The beam 15 is formed including a conducting layer, in the present example, including the polysilicon layer.

In the micro-electromechanical device 1 according to the first embodiment, the DC bias voltage $V_{DC}$ is applied to the beam 15, as mentioned earlier. The high frequency signal (RF) and the reference frequency signal (L0), which are input from the one of the lower electrodes 12 and from the beam 15 through the 1st and 2nd input terminals t1 and t3, respectively, are mixed by means of the beam 15, and another high frequency signal is output from the other of the lower electrodes 13 through the output terminal t2. Namely, by inputting the high frequency signal (RF) to the electrode 12, and applying the reference frequency signal (L0), which is superposed on the DC bias voltage $V_{DC}$, to the beam 15, the beam 15 is made to resonate mechanically owning to the difference in frequency between the high frequency signal (RF) and the reference frequency signal (L0), and the signal having the differential frequency is output from the other lower electrode 13 through a signal line to the output terminal t2. Incidentally, the beam 15 is formed so that its characteristic resonance frequency coincides with the abovementioned differential frequency.

The micro-electromechanical device 1 according to the first embodiment of the invention functions as a so-called mixer-filter element. The mixer-filter is herein defined as the device capable of mixing two input signals having frequencies different from each other and outputting a further signal having another frequency, namely, the device for selecting a desired bandwidth of inputted information signals and carrying out frequency conversion (i.e., performing both selection, and conversion of the frequency, simultaneously).

In the next place, the principle of the mixer-filter is explained. As illustrated schematically in FIG. 18, an ordinary filter is a device for cutting out information in desired frequency bandwidth out of input information. On the other hand, as shown schematically in FIG. 19, the mixer-filter is a device to cut out information in desired frequency bandwidth and simultaneously output the information with the central frequency of bandwidth shifted from the inputs. Namely, the signals having the differential frequency f(IF), f(IF)=f(RF)−f(L0), resulted from the high frequency signal (RF) and the reference frequency signal (L0), are output.

Figure 20:
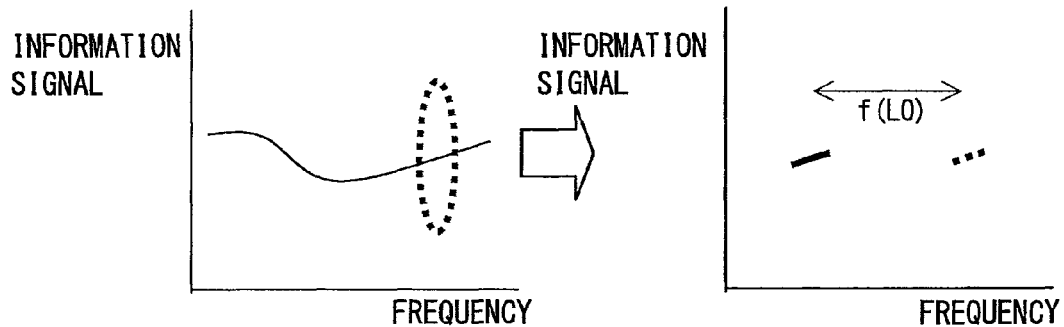
FIG. 20 is a schematic explanatory drawing of a mixer-filter.

MEMS mixer-filter will be described herein in more detail in comparison with MEMS filter. FIG. 20 schematically illustrates the MEMS filter having the second harmonic oscillation mode, in which an input electrode 102 and an output electrode 103, both as lower electrodes, are formed each facing a beam 101. Upon application of a DC bias voltage $V_{DC}$ to the beam 101 and input of a high frequency signal (RF) to the input electrode 12, an electrostatic force F is exerted on the beam 101, which is expressed by the relation, $$F \propto (V_{DC}+V_{RF})^2,$$

and this follows $$F \propto \ldots + |V_{DC}| \times |V_{RF}| \times \cos(\omega_{RF})t + \ldots$$

When the resonance frequency of the beam 101 is selected to be equal to the frequency of the high frequency signal (RF), the beam 101 is subjected to a resonance phenomenon at the frequency of the high frequency signal (RF), and a high frequency signal (RF) at this frequency is output from the output electrode 103.

Figure 21:
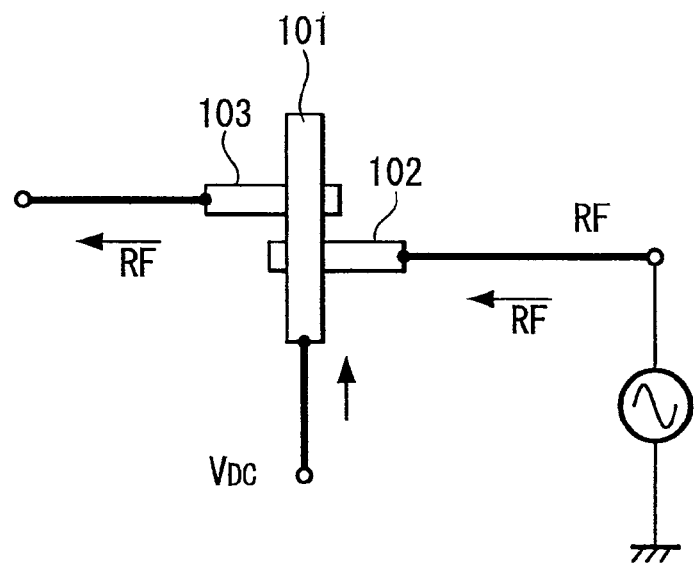
FIG. 21 is a conceptual diagram of the oscillator element for explaining operation principles of a normal MEMS filter.
Figure 22:
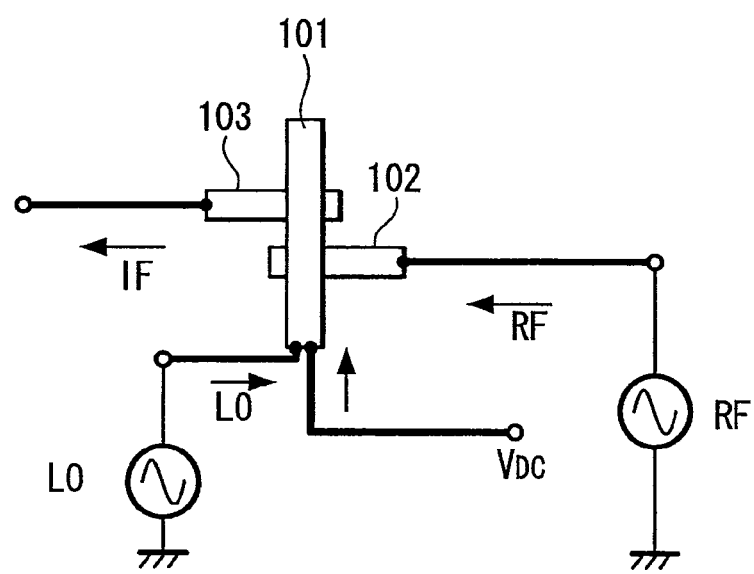
FIG. 22 is a conceptual diagram of the oscillator element for explaining operation principles of a MEMS mixer-filter.

On the other hand, FIG. 21 schematically illustrates MEMS mixer-filter having the second harmonic oscillation mode. The MEMS mixer-filter has a structure similar to that shown in FIG. 20, in which an input electrode 102 and an output electrode 103, both as lower electrodes, are formed each facing a beam 101. A DC bias voltage $V_{DC}$ is applied to the beam 101. Upon inputting a high frequency signal (RF) and a low-frequency reference signal (L0) to the input electrode 102 and the beam 101, respectively, an electrostatic force F is exerted on the beam 101, which is expressed by the relation, $$F \propto (V_{DC}+V_{RF}-V_{LO})^2,$$

and this follows $$(V_{DC}+V_{RF}-V_{LO})^2 = \ldots + |V_{RF}| \times |V_{LO}| \times \cos(\omega_{RF}-\omega_{LO})t + \ldots$$

The force F thus contains the component corresponding to the force exerted at the differential frequency resulted from the high frequency signal (RF) and the low-frequency reference signal (L0). By selecting the characteristic resonance frequency of the beam 101 to be equal to the differential frequency, the beam 101 induces a resonance phenomenon at the differential frequency, and a differential frequency signal (IF) at this frequency is output from the output electrode 103.

In the abovementioned first embodiment, there applied are the high frequency signal (RF) to the lower electrode 12, the reference frequency signal (L0) to the beam 15, and the DC bias voltage to the beam 15, respectively. Since the beam 15 is designed so that its secondary mode resonance frequency coincides with the differential frequency, RF−L0, the signal (IF) with the frequency corresponding to the oscillation of the beam 15 (i.e., the abovementioned differential frequency) is output from the lower electrode 13.

With the micro-electromechanical device 1 according to the first embodiment, i.e., oscillator element, the mixing of two high frequency signals can be carried out, and also the signal at the differential frequency of the two high frequency signals can be derived. This oscillator element has the so-called mixer-filter capabilities. According to this first embodiment, a circuit configuration having the mixer-filter capabilities can be formed with single micro-electromechanical device, whereby a substantial simplification of the high frequency circuits can be achieved.

Figure 2A:
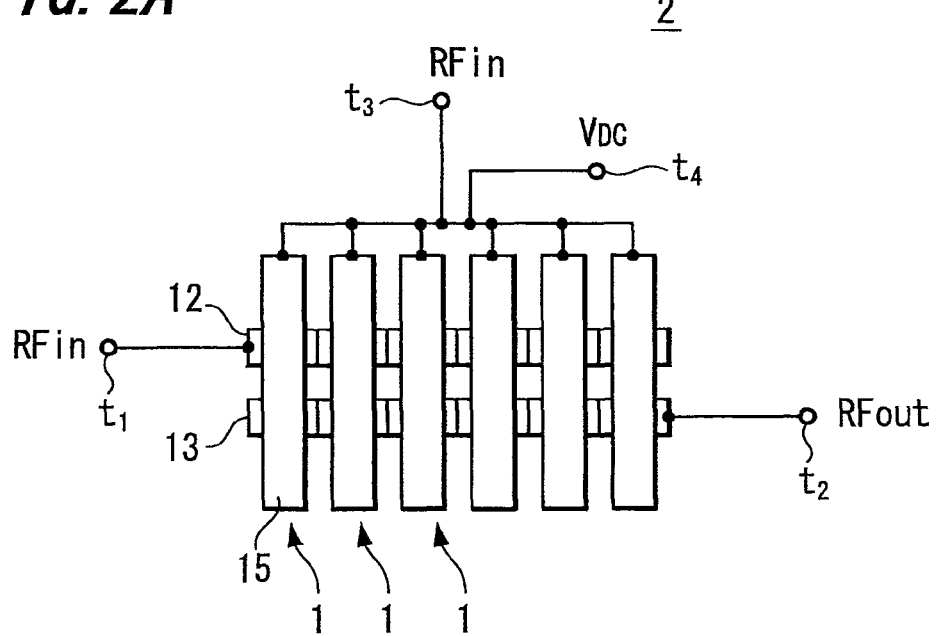
FIGS. 2A, 2B are schematic diagrams illustrating a micro-electromechanical device according to a second embodiment of the invention.
Figure 2B:
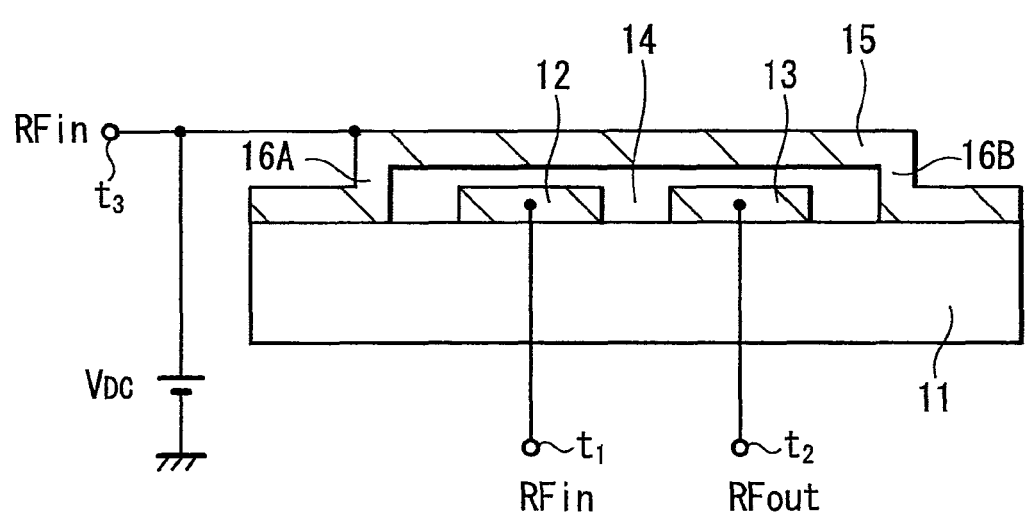

In FIGS. 2A and 2B, a second embodiment according to the invention is shown. A micro-electromechanical device 2 according to the second embodiment is formed by oscillator elements in which the micro-electromechanical devices (oscillator elements) 1 of the FIG. 1 are connected in parallel and are parallelized. Namely, the micro-electromechanical device 2 is formed by arranging the plurality of the oscillator elements 1 on the same substrate 11 such that the beams 15 are aligned in parallel with each other and by assembling to be connected in common electrodes 12 and 13 to be used as lower electrodes corresponding to the oscillator elements 1, respectively. The beams 15 are connected in common, and both the 2nd input terminal t3 and the terminal t4 for supplying the DC bias voltage $V_{DC}$ are taken out from this common connection. From the electrodes 12 as one of the common connections, the 1st input terminal t1 is taken out, while the output terminal t2 is taken out from the electrodes 13 as the other of the common connections. This micro-electromechanical device 2 is also the oscillator element of the secondary oscillation mode, as in the abovementioned embodiment.

In the micro-electromechanical device 2 according to the second embodiment, in a manner similar to the first embodiment, a high frequency signal (RF) and a reference frequency signal (L0) are input, for example, to the electrodes 12 as the one of the lower electrodes and to the beam 15, respectively, the thus input high frequency signal (RF) and the reference frequency signal (L0) are mixed by the beam 15, and a signal having the differential frequency between the high frequency signal (RF) and the reference frequency signal (L0) is output from the electrodes 13 as the other of the lower electrodes.

With the micro-electromechanical device 2 according to the second embodiment, i.e., parallelized oscillator elements, the mixing of two high frequency signals can be carried out in a manner similar to the abovementioned embodiment, and the signal at the differential frequency of the two high frequency signals can be derived as an output. This oscillator element has the so-called mixer-filter capabilities. According to this embodiment, a circuit configuration having the mixer-filter capabilities can be simplified by using one single micro-electromechanical device, whereby substantial simplification of high frequency circuits can be achieved. In addition, because of the parallelized structure of the plurality of oscillator elements, the signal output can be increased.

Figure 10:
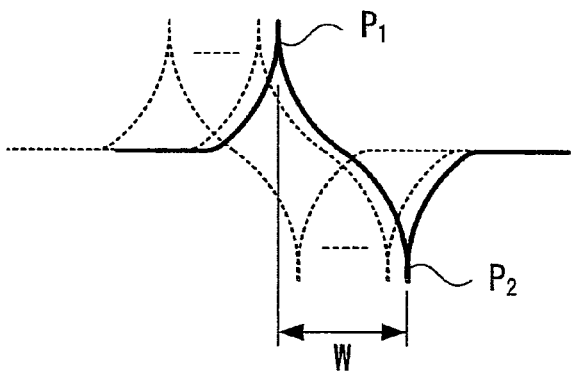
FIG. 10 is a drawing for explaining another embodiment of the invention.

In the abovementioned second embodiment, another structure may be possible that the resonance frequency of each beam 15 of the plurality of oscillator elements 1 connected in parallel is distributed throughout a required frequency range. That is, the resonance frequency of each beam 15 is designed as shown in FIG. 10 to vary gradually from one beam to another covering the frequency range with the width W from resonance peak P1 to anti-resonance peak P2 of one oscillator element 1. With this configuration, the signal desired to be derived as an output, which is included in the signal bandwidth of original high frequency conveyance signals, can be obtained without omission as output signals when the high frequency signals are subjected to frequency modulation using the required reference frequency signal.

Figure 3A:
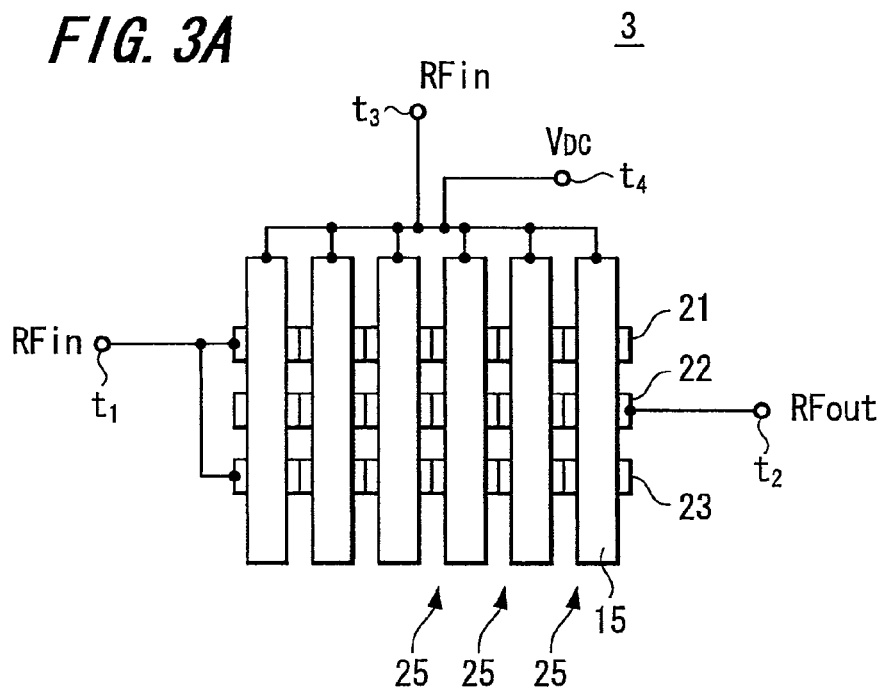
FIGS. 3A, 3B are schematic diagrams illustrating a micro-electromechanical device according to a third embodiment of the invention.
Figure 3B:
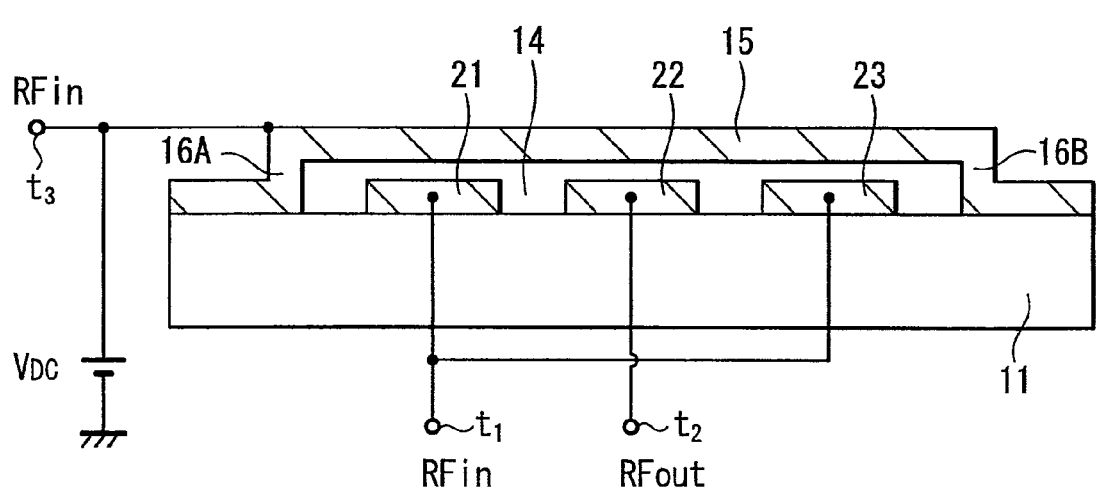

In FIGS. 3A and 3B, a third embodiment according to the invention is shown. A micro-electromechanical device 3 according to the third embodiment is the case where the device is formed as an oscillator element of the third oscillation mode. The micro-electromechanical device 3 according to the third embodiment is formed by oscillator elements in which a plurality of oscillator elements 25 are connected in parallel and are parallelized, each having three electrodes 21, 22, and 23 formed on a substrate 11 at evenly spaced intervals, for example, to be used as lower electrodes, and having a beam 15 which is disposed facing these three electrodes 21 through 23 across an intervening space 14 to oscillate by electrostatic drive. Namely, the oscillator element 3 is formed by arranging the plurality of oscillator elements 25 of the third oscillation mode on the same substrate 11 such that the beams 15 are aligned in parallel with each other and the electrodes 21, 22, and 23 to be used as lower electrodes corresponding to each of the oscillator elements 25 are respectively assembled so as to be connected in common. The beams 15 are also connected in common, and both the 2nd input terminal t3 and the terminal t4 for supplying the DC bias voltage $V_{DC}$ are taken out from this common connection. The assembled electrodes 21 and 23 by connecting in common are further interconnected in common, and the 1st input terminal t1 is taken out therefrom. The output terminal t2 is taken out from the electrodes 22 connected in common.

In the micro-electromechanical device 3 according to the third embodiment, in a manner similar to the above-mentioned embodiments, a high frequency signal (RF) input to the electrodes 21 and 23 as lower electrodes, for example, and a reference frequency signal (L0) input from the beam 15 are mixed by the beam 15, and a signal having the differential frequency between the high frequency signal (RF) and the reference frequency signal (L0) is output from the electrodes 22 as lower electrodes.

By means of the micro-electromechanical device 3 according to the third embodiment, i.e., the parallelized oscillator elements, mixing of two high frequency signals can be carried out in a manner similar to the abovementioned embodiments, and the signal at the differential frequency of the two high frequency signals can be derived as an output. This oscillator element has the so-called mixer-filter capabilities. According to this embodiment, a circuit configuration having the mixer-filter capabilities can be simplified by using single micro-electromechanical device, whereby another substantial simplification of high frequency circuits can be achieved. In addition, because of the parallelized structure of the plurality of oscillator elements, the signal output can be increased. Still in addition, because of the structure including the two electrodes 21, 23, which are formed as the input side electrodes facing the beam 15 for driving the oscillator elements, the input impedance of the oscillator elements can be decreased, whereby the circuitry matching with the amplifier at the preceding stage can be carried out more easily and the signal output can be increased.

In the parallelized structure of the oscillator elements shown in FIG. 3, another structure may be possible that the lower electrodes 22 are used for inputs, the electrodes 21, 23 are for outputs, and the remaining portions are the same as those in FIG. 3. Since the output electrode is formed with the two electrodes 21, 23 in this case, the output impedance of the present oscillator element can be decreased. As a result, the circuitry matching to the amplifier at the following stage can be carried out more easily and the signal output can be increased. In addition, this structure can also offer the actions and advantageous effects similar to those described with reference to FIG. 3.

Figure 4A:
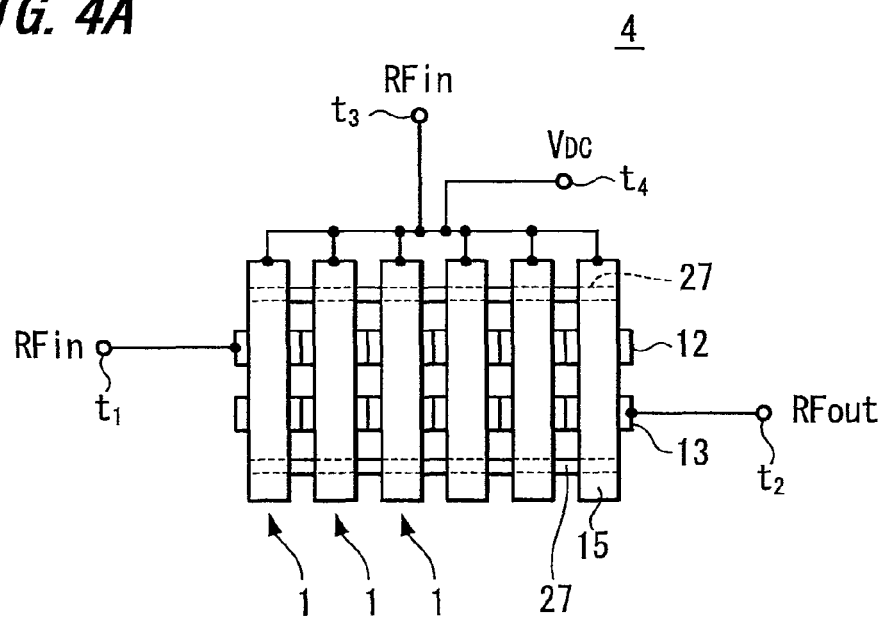
FIGS. 4A, 4B are schematic diagrams illustrating a micro-electromechanical device according to a fourth embodiment of the invention.
Figure 4B:
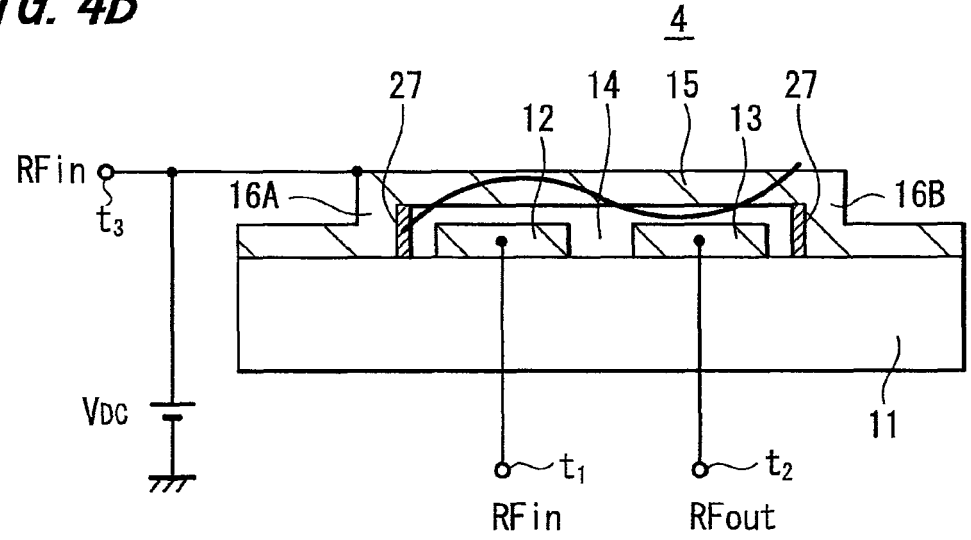

In FIGS. 4A and 4B, a fourth embodiment according to the invention is shown. A micro-electromechanical device 4 according to the fourth embodiment is formed on the basis of the structure shown in FIG. 2 by additionally connecting in common the portions of the beams 15, each corresponding to the node of the secondary oscillation mode (both ends of each beam 15), by anchor parts 27. The remaining portions are arranged similarly to those shown in FIG. 2.

With the micro-electromechanical device 4 according to the fourth embodiment, the transfer of oscillation energy can be carried out more easily among the beams by connecting the beams 15 of the plurality of oscillator elements by the anchor parts 27, whereby the effects of collective resonance by the oscillator group can be derived as an output. In addition, this structure can also offer the actions and advantageous effects similar to those described with reference to FIG. 2.

Figure 5A:
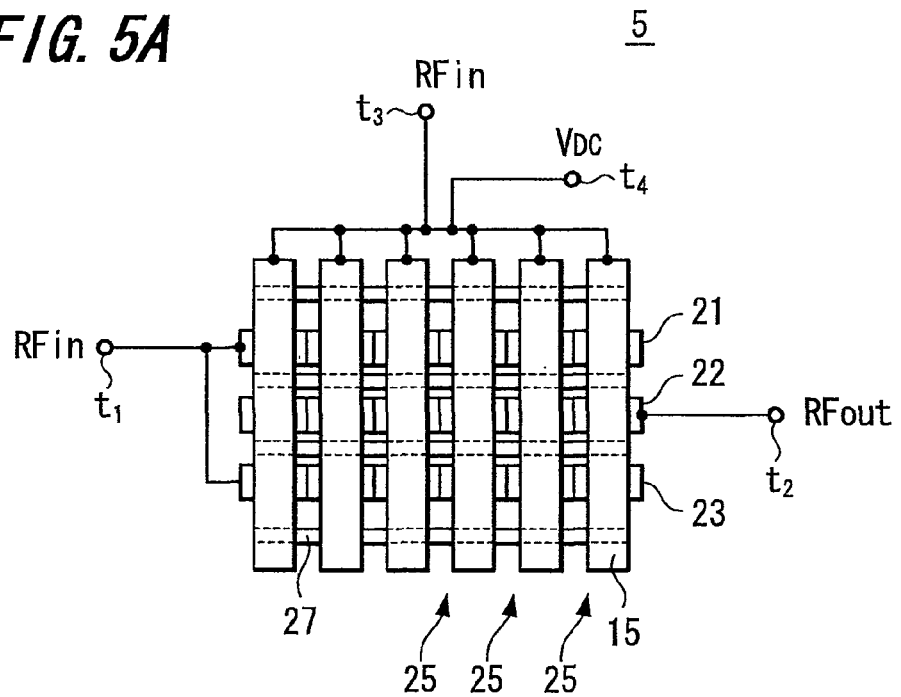
FIGS. 5A, 5B are schematic diagrams illustrating a micro-electromechanical device according to a fifth embodiment of the invention.
Figure 5B:
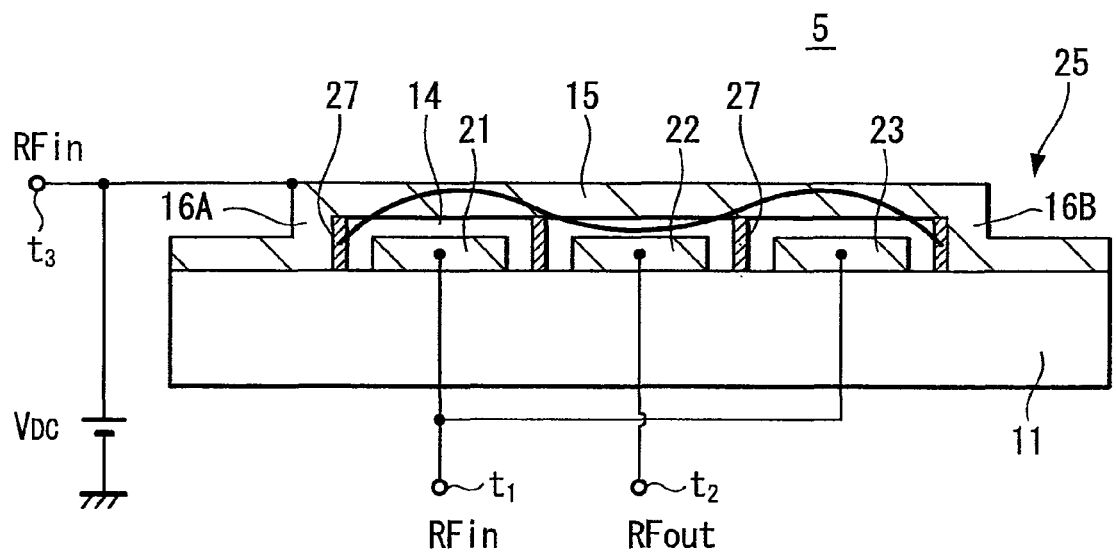

In FIGS. 5A and 5B, a fifth embodiment according to the invention is shown. A micro-electromechanical device 5 according to the fifth embodiment is formed on the basis of the structure shown in FIG. 3 by additionally connecting in common the portions of the nodes of the third oscillation mode of the beams 15 by common post parts 27 (in the middle of the beams 15) and portions at both ends of the beams 15. The remaining portions are arranged similarly to those shown in FIG. 3.

With the micro-electromechanical device 5 according to the fifth embodiment, since the beams of the plurality of oscillator elements are connected to each other with the post parts 27, the oscillation can be made uniform for the beams 15 and the oscillator elements can resonate more easily as a whole. In addition, this structure can also offer the actions and advantageous effects similar to those described with reference to FIG. 3. Still in addition, by providing the post parts as mentioned above, sticking can be suppressed during the process for forming sacrificial layers as the protection of the electrodes and beams, whereby the formation of long beams becomes feasible with more ease.

Although not shown herein in a drawing, as the micro-electromechanical device according to another embodiment of the invention, a micro-electromechanical device of the fourth or higher oscillation mode may be formed. In such a case, the device may be formed so as to include two or more input electrodes as the lower electrodes correspondingly to respective higher oscillation modes. In addition, two or more output electrodes may be included as the lower electrodes.

Figure 11:
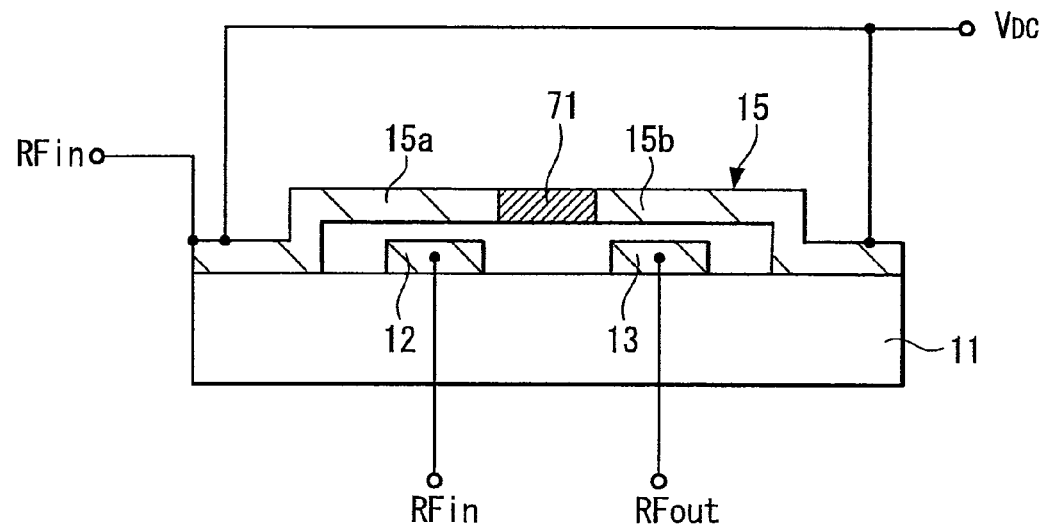
FIG. 11 is a schematic diagram illustrating another embodiment of the invention.

As the micro-electromechanical device according to still another embodiment of the invention, a micro-electromechanical device may be formed as shown in FIG. 11 such that the portions of the beam 15 in the oscillator element are formed by an insulator 71, exclusive of the portions either facing the lower electrodes 12, 13 or serving as wiring led to the beam 15 for applying the DC bias voltage $V_{DC}$ and transmitting signals. In the present example, the insulator 71 is disposed in the middle of the beam 15 facing the space between the lower electrodes 12, 13. The DC bias voltage $V_{DC}$ is applied by way of both beam portions 15a, 15b divided by the insulator 71. In the present construction, the portions of the beam 15, which are practically effective for the capacitor capability, are the beam portions 15a, 15b respectively facing the lower electrodes 12, 13. Since other portions of the beam are formed of the insulator 71, superfluous stray capacitance decreases and unnecessary noises also decrease. As a result, when this structure is adapted to a resonator, for example, its capabilities can be improved. In addition, since the through-passage of input high frequency signals and reference frequency signals to the output electrode can be suppressed, signal-to-noise ratios of output mixer-filter signals can be improved.

Figure 6:
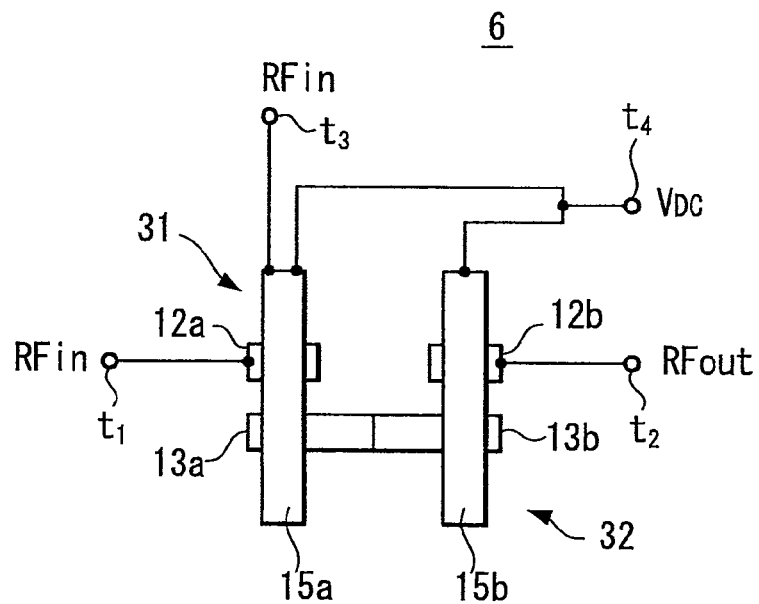
FIG. 6 is a schematic diagram illustrating a micro-electromechanical device according to a sixth embodiment of the invention.

There is shown in FIG. 6 is a sixth embodiment according to the invention. A micro-electromechanical device 6 according to the sixth embodiment is formed by two oscillator elements of the secondary oscillation mode 31 and 32, connected in series and serialized. The first oscillator element 31 includes two electrodes 12a, 13a formed as lower electrodes on a substrate, and a beam 15a which is formed facing the electrodes 12a, 13a across an intervening space. The second oscillation element 32 has a similar configuration, including two electrodes 12b, 13b formed as lower electrodes on the same substrate, and a beam 15b which is formed facing the electrodes 12b, 13b across an intervening space. Subsequently, two corresponding electrodes 12b, 13b included respectively in the oscillator elements 31, 32 are interconnected, whereby an oscillator element is formed to be the micro-electromechanical device 6.

In the first oscillator element 31, the one of the electrodes, i.e., the electrode 12a, is used as an input electrode and the 1st input terminal t1 is taken out from the electrode 12a, while the 2nd input terminal t3 is taken out from the beam 15. The other of the electrodes, i.e., the electrode 13a, is used as an output terminal. In a manner similar to the abovementioned embodiments, the 1st and 2nd input terminals t1 and t3 are each configured to be input with high frequency signals at the frequencies different from each other. In the second oscillator element 32, the one of the electrodes, i.e., the electrode 12b, is used as an output electrode and an output terminal t2 is taken out from the electrode 12b. The other of the electrodes, i.e., the electrode 13b, which is connected to the output electrode 13a of the first oscillator element 31, is used as an input terminal. In addition, the beams 15a, 15b of the first and second oscillator elements 31 and 32 are connected in common, respectively, and a supply terminal t4 for supplying the DC bias voltage $V_{DC}$ is taken out from this common connection. Still in addition, the beams 15a, 15b of the first oscillator element 31 and the second oscillator element 32 are each formed such that their characteristic resonance frequencies coincide with the differential frequency which will be described hereinbelow.

In the micro-electromechanical device 6 according to the sixth embodiment, in the first oscillator element 31, in a manner similar to the embodiments mentioned above, a high frequency signal (RF) and a reference frequency signal (L0) are input, for example, to the input electrode 12a of the lower electrode and to the beam 15a, respectively, the thus input high frequency signal (RF) and the reference frequency signal (L0) are mixed by the beam 15a, and are output from the output electrode 13a of the lower electrode through the resonance caused in the beam 15a. The thus output signal is input to the input electrode 13b as one of the lower electrodes of the second oscillator element 32, and is output from the output electrode 12b through the resonance in the beam 15b. Namely, in the first oscillator element 31, a signal having the differential frequency between the high frequency signal (RF) and the reference frequency signal (L0), which is obtained with the beam 15a, is output from the electrodes 13b. This output signal is input to the second oscillator element 32, causes the resonance in the beam 15b, and the signal at the above-mentioned differential frequency is output from the electrode 13b.

With the micro-electromechanical device 6 according to the sixth embodiment, since the device is formed by the first oscillator element 31 having the mixer-filter capabilities and the second oscillator element 32 having the filter capabilities, which are serialized, unnecessary noises can be decreased. In addition, since the through-passage of input high frequency signals and reference frequency signals to the output electrode is suppressed, signal-to-noise ratios of output mixer-filter signals can be improved. This structure can offer the actions and advantageous effects similar to those described with reference to FIG. 1. Incidentally, although there illustrated in FIG. 6 is the case where one second oscillator element 32 is added at the subsequent stage of the first oscillator element 31, an alternative structure may be possible by serializing a plurality of oscillator elements in place of the second oscillator element 32, i.e., by connecting oscillator elements at multiple stages successively such that the output electrode of a first oscillator element at the preceding stage is connected to the input electrode of a second oscillator element at the subsequent stage and so on.

Figure 7:
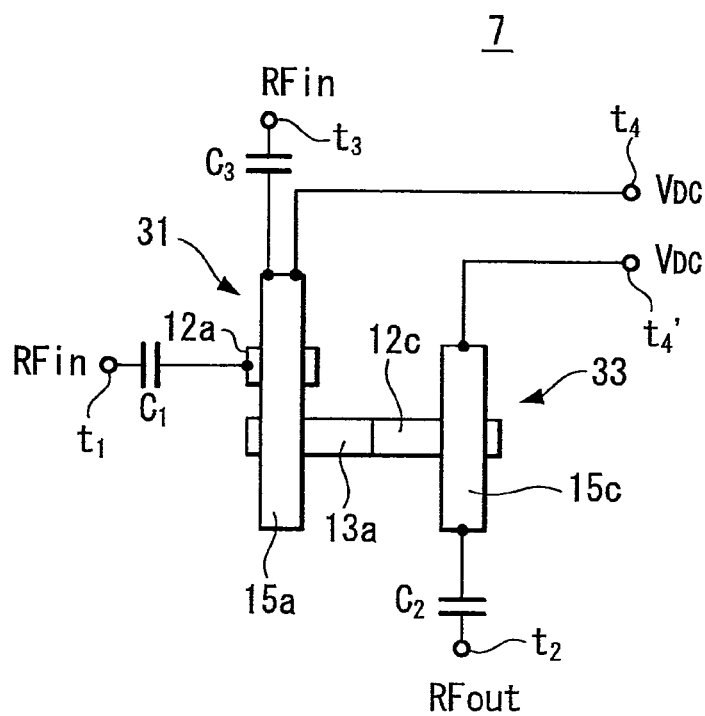
FIG. 7 is a schematic diagram illustrating a micro-electromechanical device according to a seventh embodiment of the invention.

There is shown in FIG. 7 a seventh embodiment according to the invention. A micro-electromechanical device 7 according to the seventh embodiment is formed by two kinds of oscillator elements, i.e., a first oscillator element 31 utilizing the secondary mode oscillation and a second oscillator element 33 utilizing the primary mode oscillation, which are serialized. The first oscillator element 31 is configured to include two electrodes 12a, 13a as lower electrodes formed on a substrate, and a beam 15a formed facing the electrodes 12a, 13a across an intervening space. The second oscillator element 33 is configured to include one lower electrode 12c formed on the same substrate, and a beam 15c formed facing the electrode lower electrode 12c across an intervening space. Subsequently, by connecting the electrode 13a of the oscillator element 31 and the electrode 12c of the oscillator element 33, an oscillator element is formed as the micro-electromechanical device 7.

In the first oscillator element 31, one of the electrodes, i.e., the electrode 12a, is used as an input electrode and the 1st input terminal t1 is taken out from the electrode 12a by way of a capacitor C1, while the 2nd input terminal t3 is taken out from the beam 15a by way of a capacitor C3. The other of the electrodes, i.e., the electrode 13a, is used as an output electrode. In a manner similar to the above-mentioned embodiments, the 1st and 2nd input terminals t1 and t3 are each configured to be input with high frequency signals at the frequencies different from each other. In the second oscillator element 33, the electrode 12c is used as an input electrode, the beam 15c is used as an output electrode, and a capacitor C2 is connected between the beam 15c and an output terminal t2. In addition, the beams 15a and 15c of the first and second oscillator elements 31 and 33 are connected in common, respectively, and supply terminals t4 and t4' for supplying the DC bias voltage $V_{DC}$ are taken out from this common connection. The beams 15a, 15c of the first oscillator element 31 and the second oscillator element 33 are each formed such that their characteristic resonance frequencies coincide with the differential frequency which will be described hereinbelow.

In the micro-electromechanical device 7 according to the seventh embodiment, in the first oscillator element 31, in a manner similar to the embodiments mentioned above, a high frequency signal (RF) and a reference frequency signal (L0) are input, for example, to the electrode 12a as the lower electrode and to the beam 15a, respectively, the thus input high frequency signal (RF) and the reference frequency signal (L0) are mixed by the beam 15a, and are output from the output electrode 13a of the lower electrode through the resonance caused in the beam 15a. The output signal is input to the input electrode 12c as the lower electrode of the second oscillator element 33, and is output from the beam 15c through the resonance caused in the beam 15c. Namely, in the first oscillator element 31, a signal having the differential frequency between the high frequency signal (RF) and the reference frequency signal (L0), which is obtained with the beam 15a, is output from the electrodes 13a. This output signal is input to the lower electrode 12c of the second oscillator element 33, resonates the beam 15c, and the signal at the abovementioned differential frequency is output from the beam 15c.

With the micro-electromechanical device 7 according to the seventh embodiment, since the device is formed by the first oscillator element 31 having the mixer-filter capabilities and the second oscillator element 33 having the filter capabilities, which are serialized, through-passage of input high frequency signals and reference frequency signals to the output electrode can be suppressed, and signal-to-noise ratios of output mixer-filter signals can be improved. In addition, the capacitors C1, C3 serve to suppress signals (noises) in the resonance frequency range of beams 15a, and to prevent the DC current from leaking into high frequency lines as well. The capacitor C2 serves to prevent the DC current from leaking into high frequency lines, and to suppress signals (noises) in the low frequency range. Thus, by serializing the oscillator elements and by disposing the capacitors in the high frequency lines, suppression of unnecessary noises can be achieved. In addition, this structure can offer the actions and advantageous effects similar to those described with reference to FIG. 1. Incidentally, although there illustrated in FIG. 7 is the case where one second oscillator element 33 is added at the subsequent stage of the first oscillator element 31, an alternative structure may be possible by serializing a plurality of oscillator elements in place of the second oscillator element 33, i.e., by connecting oscillator elements at multiple stages successively such that the output electrode of a first oscillator element at the preceding stage is connected to the input electrode of a second oscillator element at the subsequent stage and so on.

Figure 8:
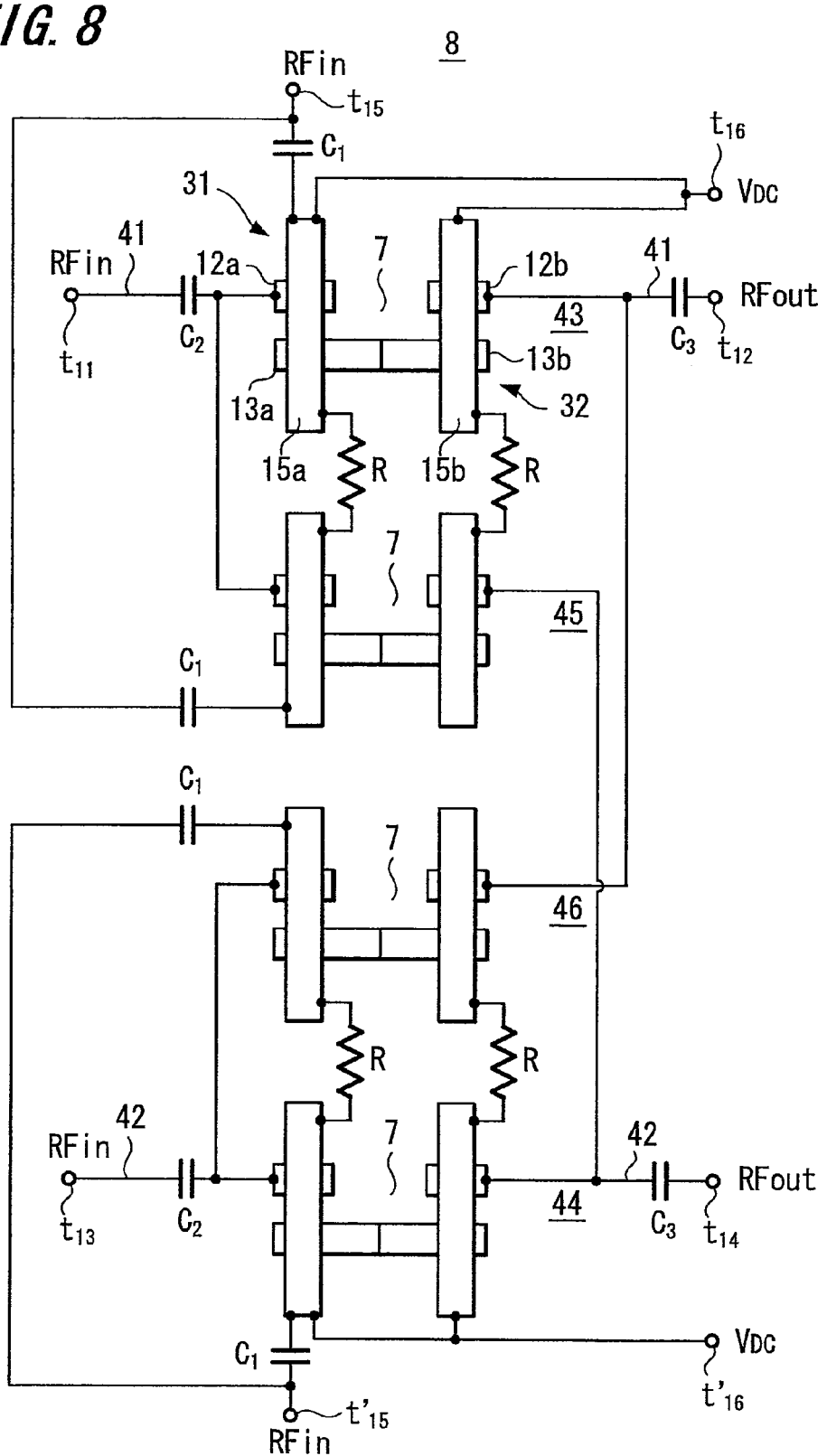
FIG. 8 is a schematic diagram illustrating a micro-electromechanical device according to an eighth embodiment of the invention.

There is shown in FIG. 8 an eighth embodiment according to the invention. A micro-electromechanical device 8 according to the eighth embodiment is an example that a filter is formed using one of the aforementioned micro-electromechanical devices, i.e., the oscillator elements having the mixer-filter capabilities. A mixer-filter 8 according to the eighth embodiment is a filter configured to handle balanced input/output signals. This filter is formed as a filter to handle balanced input/output signals by connecting the aforementioned oscillator elements or preferably a group of resonators, each including parallelized oscillator elements, in a lattice-like fashion.

Figure 9:
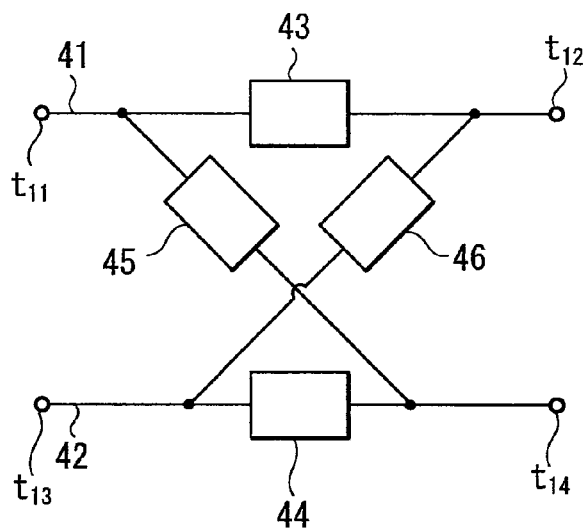
FIG. 9 is a drawing illustrating the equivalent circuit of the micro-electromechanical device of the eighth embodiment.

The filter, which is formed by including resonators connected in a lattice-like fashion, is called a lattice-type filter. The lattice-type filter is constructed of two kinds of resonators having resonance frequencies different from each other. As illustrated by the equivalent circuit of FIG. 9, the lattice-type filter is formed by including two signal lines 41 and 42 connected with resonators 43, 44 each having high resonance frequencies, and by additionally including two resonators 45, 46 each having substantially the same low resonance frequency. The resonators 45, 46 are connected, respectively, between the input side of the resonator 43 on the signal line 41 and the output side of the resonator 44 on the signal line 42, and between the input side of the resonator 44 on the signal line 42 and the output side of the resonator 43 on the signal line 41. The input ends of the signal lines 41 and 42 are configured to be input with signals different in phase by 180° from each other.

Namely, the micro-electromechanical device according to the present embodiment, i.e., the so-called mixer-filter 8, is formed as the abovementioned two kinds of resonators having resonance frequencies different from each other disposed on a common substrate, by arranging two resonators 43, 44 having high resonance frequencies and formed by the oscillator element 6 shown in FIG. 6, for example, and additional two resonators 45, 46 having low resonance frequencies and formed by the oscillator element 6. In this example, these two resonators 45 and 46 having low resonance frequencies are disposed between the two resonators 43 and 44 having high resonance frequencies, along the extension direction of the beam 15.

In addition, the lower electrode 12a on the input side and the lower electrode 12b on the output side of the parallelized oscillator element 6 forming the resonator 43 are both connected to the signal line 41. Similarly, the lower electrode 12a on the input side and the lower electrode 12b on the output side of the oscillator element 6 in the resonator 44 are both connected to the signal line 42. In addition, another oscillator element 6 in the resonator 45 and still another oscillator element 6 in the resonator 46 are connected between the signal lines 41 and 42 to intersect each other.

The terminals t11 and t12 are input and output terminals on the side of the signal line 41, respectively; t13 and t14 are input and output terminals on the side of the signal line 42, respectively; t15 and t15' are input terminals for transmitting the reference high frequency signals on the side of the signal lines 41 and 42, respectively; and t16 and t16' are the terminals for supplying the DC bias voltage V.

The beams 15a and 15b included in the resonators 43 through 46 are respectively assembled to be connected in common by way of resistors R so as to prevent high frequency signals from leaking, and are applied with the DC bias voltage V, respectively. To the beam 15a in the oscillator element 31 at the preceding stage for carrying out the mixing in the resonators 43 through 46, the reference frequency signal (L0) is input from the input terminal t15. In addition, to the electrodes 12a on the input side of the resonator 43 connected to the signal line 41 and on the input side of the resonator 44 connected to the signal line 42, high frequency signals (RF) different from each other by 180° in phase are respectively input.

In this structure, a capacitor C1 is connected between the input terminal t15 for the reference frequency signal (L0) and the beam 15a so that the DC bias voltage $V_{DC}$ is prevented from leaking into the side of the input terminal t15. In addition, other capacitors C2 are connected between the input terminals t11, t13 for the high frequency signals and the input side electrodes 12a, 12a so that inputting of the signals having the same frequency as the differential frequency (substantial noises) is suppressed and the DC current is prevented from leaking into the side of the input terminal. Still in addition, further capacitors C3 are connected between the output terminals t12, t14 for the high frequency signals and the output side electrodes 12b, 12b so that the DC current is prevented from leaking into the output terminal. An LC circuit including an inductance L and a capacitance C may alternatively be connected to suppress noises.

With the micro-electromechanical device 8 according to the eighth embodiment, since the device is configured as a signal mixer-filter, it is feasible to convert the carrier frequency of the high frequency signals (RF) into low frequencies, and to derive only the signals in necessary bandwidth as well, whereby a substantial simplification of the high frequency circuits can be achieved. By allowing the signals to transit by means of the capacitor C1, C3, or C2 disposed between ac signal input/output terminals and either the electrode 12a or 12b, or the beam 15a, the signal mixer-filter 8 becomes capable of electrically isolating the DC bias from signal lines, which is necessary for the devices of the electrostatic drive type, whereby the signal mixer-filter with excellent characteristics can be realized. By utilizing the lattice-type filter circuit capable of handling balanced input/output signals as the signal mixer-filter, the frequency dependence with excellent symmetry of bandwidth transmission characteristics can be achieved. Although the details of DC supply lines are not shown in the drawings during the abovementioned descriptions, the lines have been assumed to conduct DC currents selectively.

As another embodiment of the micro-electromechanical device according to the invention, although not shown herein in a drawing, the oscillator elements used for forming the aforementioned micro-electromechanical devices are preferably fabricated through package processing. For example, the package processing of oscillator elements can be carried out in a series of fabrication processes including junction steps of another semiconductor wafer with the semiconductor wafer previously formed thereon with oscillator elements. As the package processing, a variety kinds of other package processing may also be utilized. In addition, it is preferable for the oscillator elements after subjected to the package processing to be surrounded by the atmosphere from which moisture and polar molecules are removed as much as possible.

With the device construction package processed as above, the atmosphere necessary for maintaining device performance of the oscillator elements is secured, and less expensive and still reliable products can be manufactured. In addition, by reducing the atmosphere surrounding the oscillator elements to lower atmospheric pressures, oscillator elements having higher Q-values can be formed.

In the next place, with reference to FIGS. 12 through 18, an embodiment of a method of fabricating the above-mentioned micro-electromechanical device, particularly the portion of one oscillator element, is described. The specification of the fabrication process is similar to that utilized in the ordinary CMOS production process.

Figure 12:
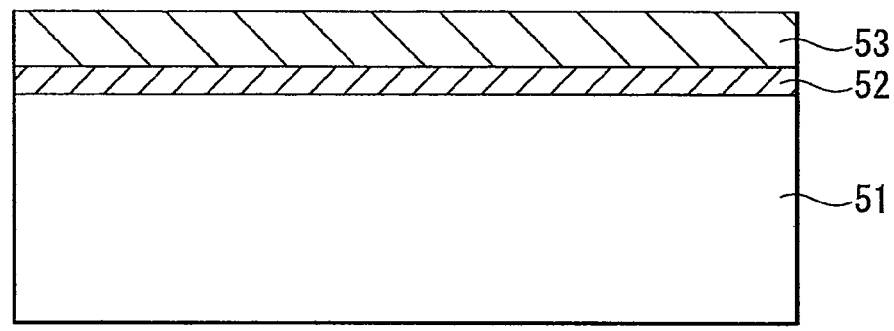
FIG. 12 is a fabrication process chart (No. 1) illustrating one embodiment of the fabrication method for the oscillator element portion of the micro-electromechanical device according to the invention.

First, as shown in FIG. 12, a composite insulation film 52 of a thin silicon oxide film (HDP film: high density plasma oxidation film) and a silicon nitride film is formed in a necessary film thickness on the surface of a silicon substrate 51 of high resistance. In this example, the film thickness of the composite insulation film 52 is 200 nm in total. Subsequently, a thin polycrystalline silicon film (PDAS: phosphorus doped amorphous silicon) 53 of conductivity is deposited to a necessary film thickness on the composite insulation film 52. The film thickness of the thin polycrystalline silicon film 53 is 380 nm in this example.

Figure 13:
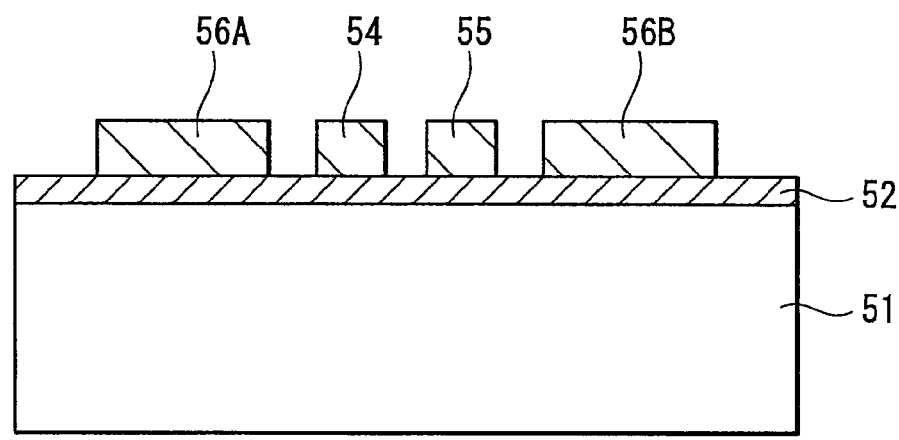
FIG. 13 is another fabrication process chart (No. 2) illustrating the embodiment of the fabrication method for the oscillator element portion of the micro-electromechanical device according to the invention.

Next, as shown in FIG. 13, a resist mask (not shown) is formed on the thin polycrystalline silicon film 53, provided with a pattern for defining lower electrodes and fixing stands for supporting the beam to be used also as a wiring layer, unnecessary portions of the thin polycrystalline silicon film 53 are removed by the dry etching method, and lower electrodes 54 and 55 and fixing stands for the beam (also serves as the wiring layer) 56 (56A, 56B) are formed of the thin polycrystalline silicon film.

Figure 14:
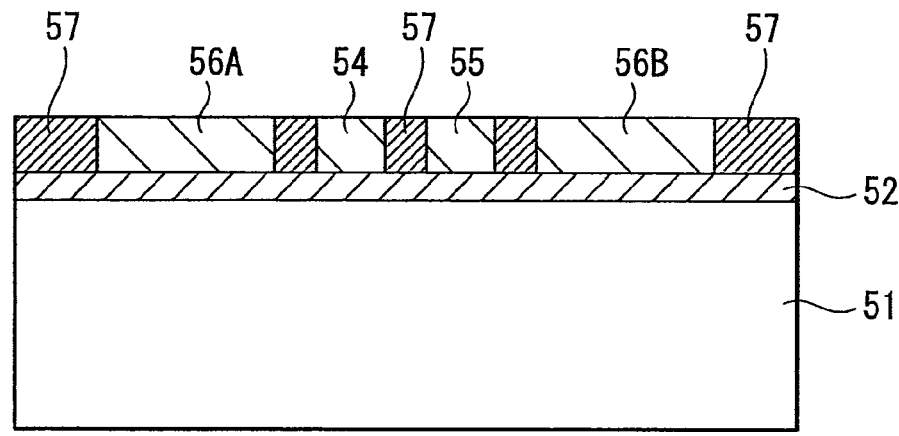
FIG. 14 is still another fabrication process chart (No. 3) illustrating the embodiment of the fabrication method for the oscillator element portion of the micro-electromechanical device according to the invention.

Next, as shown in FIG. 14, the lower electrodes 54, 55 and the fixing stands 56 for the beam are backfilled with a sacrificial layer (for example, thin silicon oxide film: HDP film) 57, and the sacrificial layer 57 is planarized by the chemical mechanical polishing method (CMP: chemical mechanical polishing), whereby the faces of the lower electrodes 54, 55 and the fixing stands 56 are exposed.

Figure 15:
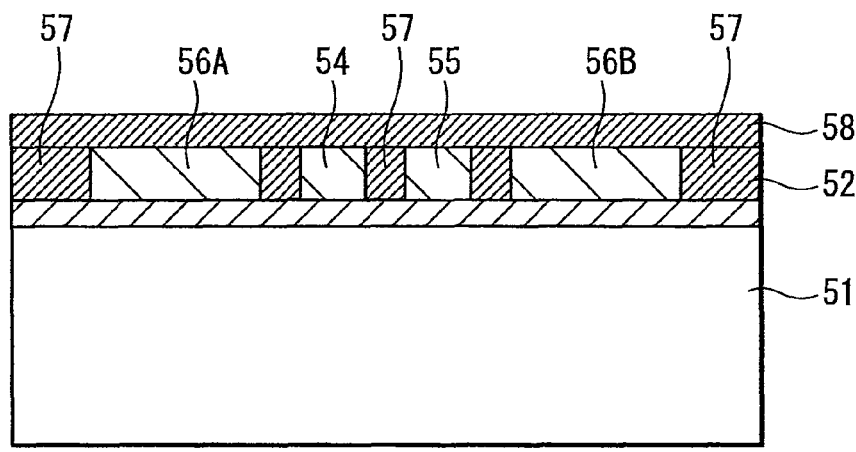
FIG. 15 is another fabrication process chart (No. 4) illustrating the embodiment of the fabrication method for the oscillator element portion of the micro-electromechanical device according to the invention.

Next, as shown in FIG. 15, another sacrificial layer 58 is formed on thus planarized thin film, having a thickness suited to the distance between the electrodes 54, 55 and the beam, which is formed afterward. The sacrificial layer 58 may be formed of thin silicon oxide film 58 (LP-TEOS: low pressure tetraethoxy silane). The film thickness of the sacrificial layer 58 is about 50 nm in this example.

Figure 16:
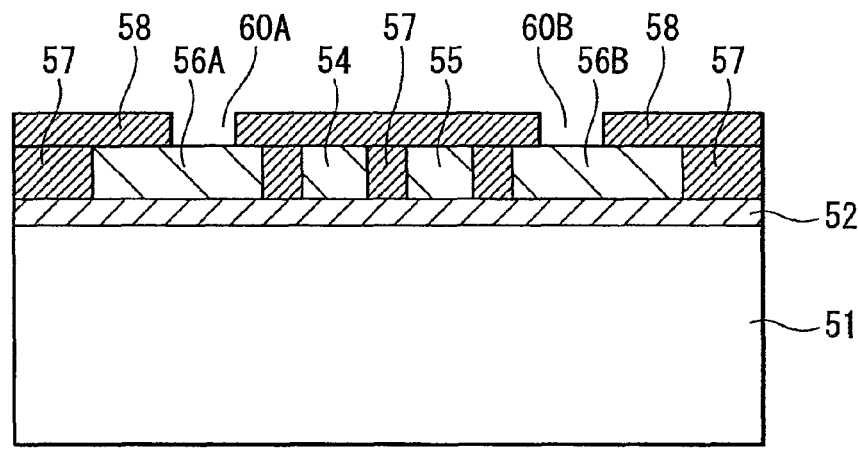
FIG. 16 is another fabrication process chart (No. 5) illustrating the embodiment of the fabrication method for the oscillator element portion of the micro-electromechanical device according to the invention.

Next, as shown in FIG. 16, through holes 60 (60A, 60B) for connecting the beam and the fixing stands 56 (56A, 56B) are formed in the thin silicon oxide film 58 by the dry etching method, for example.

Figure 17:
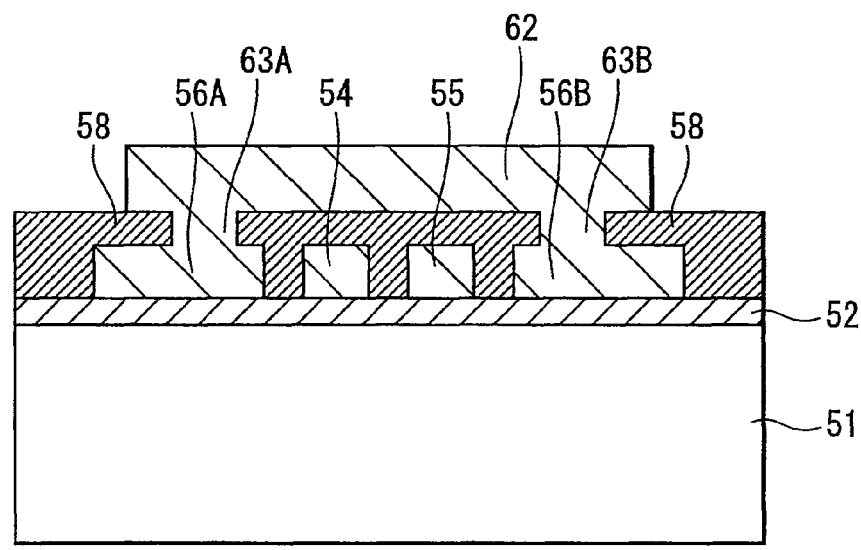
FIG. 17 is another fabrication process chart (No. 6) illustrating the embodiment of the fabrication method for the oscillator element portion of the micro-electromechanical device according to the invention.

Next, as shown in FIG. 17, after forming a thin polycrystalline silicon film (PDAS) 61 to a necessary film thickness on the thin silicon oxide film 58 including the inside of the through holes 60, a cross-beam (beam) 62 is formed through patterning, for example, by the dry etching method. The both ends of the beam 62 are fixed to the fixing stands 56 (56A, 56B) by way of supporting portions 63 (63A, 63B).

Next, although not shown as a drawing, a thin film of Al—Si for forming wiring and pad is deposited on other portions of the lamination film 52 on the substrate, and another resist mask is formed on the thin Al—Si film, having a pattern suited for defining the wiring and pad. Subsequently, a further etching processing is carried out using hydrofluoric acid solution, for example, to selectively remove unnecessary portions of the thin Al—Si film and the sacrificial layers 57, 58. Thus, as shown in FIG. 18, there formed is a desired spacing between the lower electrodes 54, 55 and the beam 62, the space 64 having a spacing of about 50 nm in this example, whereby the desired micro-electromechanical device 65 is obtained.

Figure 18:
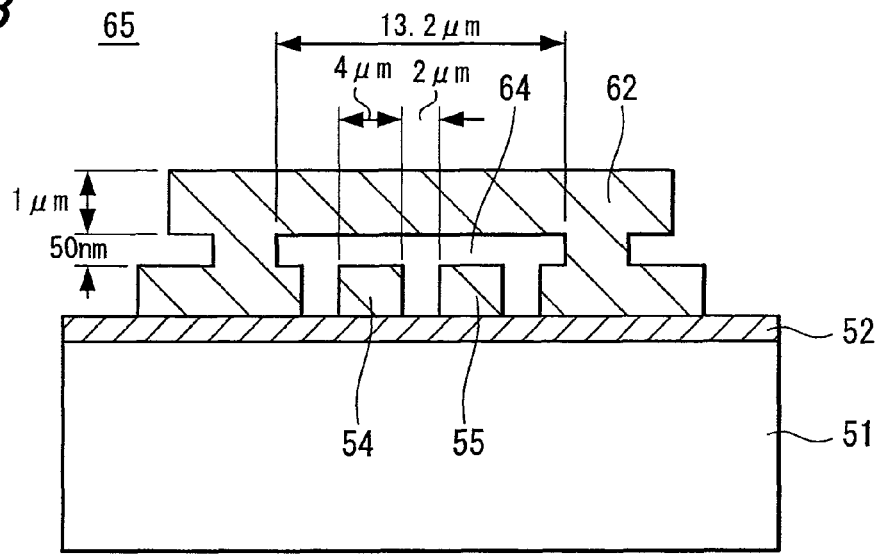
FIG. 18 is another fabrication process chart (No. 7) illustrating the embodiment of the fabrication method for the oscillator element portion of the micro-electromechanical device according to the invention.
Figure 19:
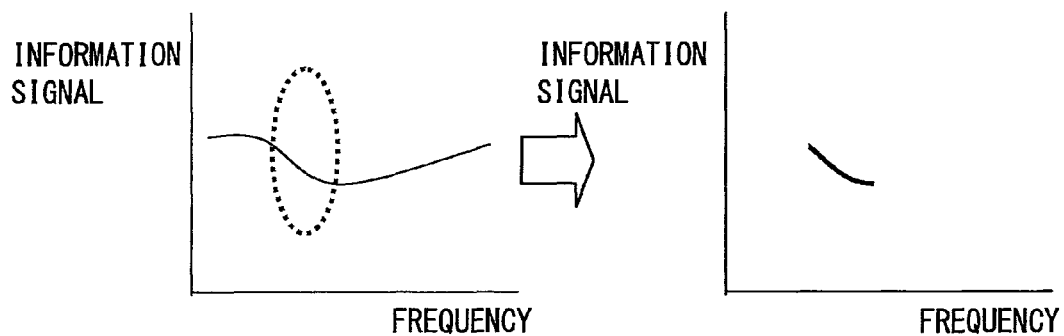
FIG. 19 is a schematic explanatory drawing of a normal filter.

As a specific example, the outlined dimensions of the above-mentioned oscillator element 65 are shown in FIG. 18. This element is designed so that its resonance frequency is set approximately to 100 MHz when the second harmonics are generated. In the oscillator element 65 presently test manufactured, the length of the beam 62 is 13.2 μm, the separation between the lower electrodes 54 and 55 is 2 μm, and the width of the electrodes 54, 55 is 4 μm in the longitudinal direction of the beam.

Figure 23:
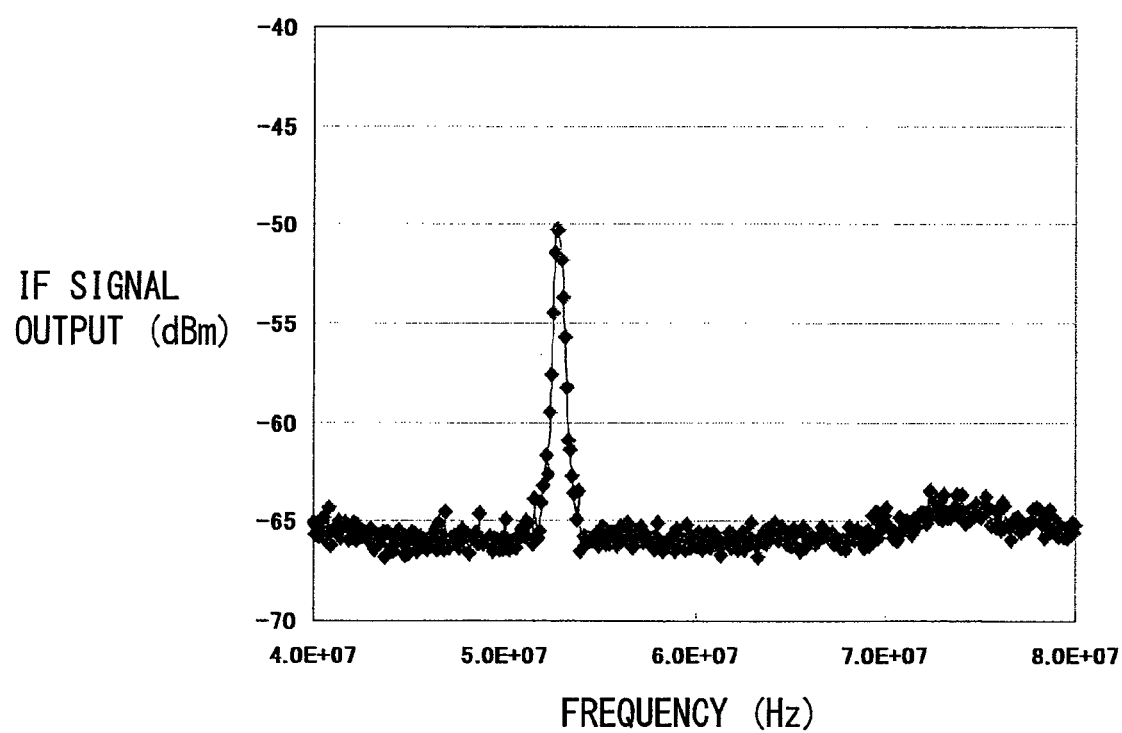
FIG. 23 shows is a spectral output drawing illustrating an output spectrum of the micro-electromechanical device.

Through the process steps similar to those as abovementioned and corresponding to the second embodiment with reference to FIG. 2, a micro-electromechanical device is fabricated, in which 360 oscillator elements are connected in parallel (arranged in 12 rows and 30 columns), each having a resonance frequency of 52.7 Mz. By turning on the power of the device and using a spectrum analyzer, output signals were evaluated. FIG. 23 shows an example of its output spectrum. The measurements were carried out in the nitrogen atmosphere at a pressure of 1 atm. In this example, sign waves from a network analyzer are utilized as RF signals applied to t1. The RF frequency was scanned periodically between 120 to 160 MHz. The signal intensity was 0 dBm. As the reference signals L0 applied to t3, sine waves from a signal generator were used. The frequency of the reference signals was 90 MHz and the signal intensity was +3 dBm. DC bias voltage of −4.5 V was applied to t4.

As the result, an output signal was obtained from the output terminal t2, having the peak frequency=52.7 MHz, peak value=−50 dBm, noise level=−66 dBm, and peak width (at the peak value of −3 dBm)=0.4 MHz (effective Q value 125). From the results, IF/RF transmission S parameter corresponding to the above peak value is approximately −50 dB. The increase of output level is feasible by increasing the Q value of the oscillator element constituting the device, the DC bias voltage, and the power of reference RF signals. The mixer filter, which is provided with further restrictions of the output signal bandwidth and improvements of the filtering form, can be materialized, for example, by connecting the oscillator elements in lattice-like fashion (lattice-type of connection) as described earlier with reference to FIG. 8.

When the above-mentioned micro-electromechanical devices are adapted to commodity products, the RF signal intensity corresponds to inputs from the outside, and L0 signals and DC bias voltages are supplied respectively from a signal generator and a power supply, which are attached to the mixer filter. In addition, the output signal intensity is amplified by using a CMOS integrated circuit. In case of products design, therefore, by counting backward from the signal intensity following the amplification, there determined are the structure of oscillator elements of the micro-electromechanical device, the number of parallelization, the Q value (depending on atmospheric pressure), the value of bias voltage, the LO signal intensity, and the amplification degree of the CMOS integrated circuit.

The micro-electromechanical devices according to the aforementioned embodiments can be adapted to various semiconductor devices such as signal mixer-filters using the oscillator elements, and SoC (system on chip) device modules, SiP (system in package) device modules, and the like, incorporating the signal mixer-filters.

By utilizing the micro-electromechanical devices according to the aforementioned embodiments of the invention, the mixing of high frequency signals is feasible, for example. Since several parts such as inductors and diodes become unnecessary, simplification of circuits can be made and the miniaturization of elements can be achieved. Since device functions are implemented by only DC bias voltage applied to the beam of oscillator elements (almost no current flow), power consumption is reduced in comparison with the elements having the conventional circuit construction.

By using the micro-electromechanical devices including parallelized oscillator elements according to the aforementioned embodiments of the invention, the output from oscillation elements of the electrostatic-drive type (namely, micro-electromechanical devices) can be improved. In addition, impedance matching to the amplifier at the stage either preceding or following the micro-electromechanical devices becomes easier, whereby a further reduction of power consumption can be achieved.

By using the micro-electromechanical devices according to the aforementioned embodiments of the invention as signal mixer-filters, desirable signals contained in high frequency carrier signals can be derived while securing sufficient bandwidth. In addition, by utilizing the micro-electromechanical devices according to the aforementioned embodiments of the invention, industrial production becomes easy.

EXPLANATION OF REFERENCE NUMERALS 1 to 8 . . . micro-electromechanical device,
11 . . . substrate,
12, 13 . . . lower electrode,
14 . . . space,
15 . . . beam,
$V_{DC}$ . . . DC bias voltage,
16 (16A, 16B) . . . supporting portion,
21 to 23 . . . lower electrode
25 . . . oscillator element,
27 . . . anchor part,
31, 32, 33 . . . oscillator element,
41 . . . signal line,
42 . . . signal line,
43 to 46 . . . resonator,
51 . . . silicon substrate,
52 . . . composite insulation film,
53 . . . thin polycrystalline silicon film,
54, 55 . . . lower electrode,
(56A, 56B) . . . fixing stand,
57, 58 . . . sacrificial layer (thin silicon oxide film),
60 (60A, 60B) . . . through hole,
62 . . . beam,
63 (63A, 63B) . . . supporting portion,
64 . . . space,
65 . . . oscillator element,
71 . . . insulator,
101 . . . beam,
102 . . . input electrode, and
103 . . . output electrode.

The invention claimed is:

1. A micro-electromechanical device, comprising:
an oscillator element including:
a plurality of electrodes formed on a substrate; and
a beam facing the electrodes and configured to oscillate by means of an electrostatic drive,
wherein,
when a high frequency signal is applied to one of the plurality of electrodes, and a reference signal is applied to the beam, an output signal is output from another one of the plurality of electrodes, the output signal having a differential frequency between the high frequency signal and the reference signal.

2. The micro-electromechanical device according to claim 1 characterized in that a plurality of the oscillator elements are connected in parallel with respect to the high frequency signal input to the oscillator elements.

3. The micro-electromechanical device according to claim 2 characterized in that resonance frequencies of the plurality of the oscillator elements connected in parallel are distributed throughout a required frequency range.

4. The micro-electromechanical device according to claim 1 characterized in that two or more input electrodes facing the beam and driving the beam are included.

5. The micro-electromechanical device according to claim 2 characterized in that two or more input electrodes facing the beam and driving the beam are included.

6. The micro-electromechanical device according to claim 3 characterized in that two or more input electrodes facing the beam and driving the beam are included.

7. The micro-electromechanical device according to claim 1 characterized in that two or more output electrodes facing the beam and deriving an output from the beam are included.

8. The micro-electromechanical device according to claim 2 characterized in that two or more output electrodes facing the beam and deriving an output from the beam are included.

9. The micro-electromechanical device according to claim 3 characterized in that two or more output electrodes facing the beam and deriving an output from the beam are included.

10. The micro-electromechanical device according to claim 1, wherein the reference signal is another high frequency signal.

11. The micro-electromechanical device according to claim 1 characterized in that one or more oscillator elements of a second electrostatic drive type are added to an output side of the oscillator element.

12. The micro-electromechanical device according to claim 1 characterized in that the micro-electromechanical device is configured as a signal mixer-filter.

13. The micro-electromechanical device according to claim 11 characterized in that the micro-electromechanical device is configured as a signal mixer-filter.

14. The micro-electromechanical device according to claim 12 including:
a capacitor between an alternating-current signal input/output terminal and either the electrode or the beam so that the signal mixer-filter is configured to transit a signal.

15. The micro-electromechanical device according to claim 13 including:
a capacitor between an alternating-current signal input/output terminal and either the electrode or the beam so that the signal mixer-filter is configured to transit a signal.

16. The micro-electromechanical device according to claim 12 characterized in that the signal mixer-filter is configured to handle balanced input/output signals.

17. The micro-electromechanical device according to claim 13 characterized in that the signal mixer-filter is configured to handle balanced input/output signals.

18. The micro-electromechanical device according to claim 12 characterized in that the signal mixer-filter includes a plurality of resonators connected in a lattice-like fashion so as to handle balanced input/output signals.

19. The micro-electromechanical device according to claim 13 characterized in that the signal mixer-filter includes a plurality of resonators connected in a lattice-like fashion so as to handle balanced input/output signals.

20. A micro-electromechanical device, comprising:
an oscillator element;
the oscillator element including
a plurality of electrodes formed on a substrate; and
a beam facing the electrodes and configured to oscillate by means of electrostatic drive,
characterized in that an input/output of a high frequency signal is applied to one of combinations of the plurality of electrodes and the beam, and
characterized in that portions of the beam, exclusive of portions facing the electrodes and portions serving as wiring for applying a bias voltage and for transmitting signals, are formed of an insulator.

* * * * *